(12) United States Patent
Hirobe et al.

(10) Patent No.: US 10,189,042 B2
(45) Date of Patent: Jan. 29, 2019

(54) VAPOR DEPOSITION MASK WITH METAL PLATE

(71) Applicant: Dai Nippon Printing Co., Ltd., Tokyo (JP)

(72) Inventors: Yoshinori Hirobe, Tokyo (JP); Yutaka Matsumoto, Tokyo (JP); Masato Ushikusa, Tokyo (JP); Toshihiko Takeda, Tokyo (JP); Hiroyuki Nishimura, Tokyo (JP); Katsunari Obata, Tokyo (JP); Takashi Takekoshi, Tokyo (JP)

(73) Assignee: Dai Nippon Printing Co., Ltd., Shinjuku-Ku (JP)

( * ) Notice: Subject to any disclaimer, the term of this patent is extended or adjusted under 35 U.S.C. 154(b) by 0 days.

(21) Appl. No.: 16/015,430

(22) Filed: Jun. 22, 2018

(65) Prior Publication Data

US 2018/0318864 A1 Nov. 8, 2018

Related U.S. Application Data

(60) Continuation of application No. 15/214,808, filed on Jul. 20, 2016, which is a continuation of application
(Continued)

(30) Foreign Application Priority Data

Jan. 12, 2012 (JP) .................................. 2012-004484

(51) Int. Cl.
*B05B 15/00* (2018.01)
*H01L 51/56* (2006.01)
(Continued)

(52) U.S. Cl.
CPC .............. *B05B 12/20* (2018.02); *B05B 12/22* (2018.02); *B05C 21/005* (2013.01);
(Continued)

(58) Field of Classification Search
CPC ............. H01L 51/0011; H01L 51/5012; B32B 37/182; B32B 38/0008
See application file for complete search history.

(56) References Cited

U.S. PATENT DOCUMENTS 5,792,520 A 8/1998 Yamashita et al.
6,603,159 B2 8/2003 Atobe et al.
(Continued)

FOREIGN PATENT DOCUMENTS

CN 1423511 A 6/2003
CN 1534383 A 10/2004
(Continued)

OTHER PUBLICATIONS

International Search Report (Application No. PCT/JP2013/050422) dated Feb. 19, 2013.
(Continued)

*Primary Examiner* — Seahvosh Nikmanesh
(74) *Attorney, Agent, or Firm* — Burr & Brown, PLLC

(57) ABSTRACT

A method for producing a vapor deposition mask capable of satisfying both enhancement in definition and reduction in weight even when a size increased, a method for producing a vapor deposition mask device capable of aligning the vapor deposition mask to a frame with high precision, and a method for producing an organic semiconductor element capable of producing an organic semiconductor element with high definition are provided. A metal mask provided with a slit, and a resin mask that is positioned on a front surface of the metal mask and has openings corresponding to a pattern to be produced by vapor deposition arranged by lengthwise and crosswise in a plurality of rows, are stacked.

20 Claims, 9 Drawing Sheets

Related U.S. Application Data

No. 14/719,355, filed on May 22, 2015, now Pat. No. 9,527,098, which is a division of application No. 14/371,670, filed as application No. PCT/JP2013/050422 on Jan. 11, 2013, now Pat. No. 9,108,216.

(51) Int. Cl.
*H01L 51/00* (2006.01)
*B05B 12/20* (2018.01)
*C23C 14/04* (2006.01)
*B05C 21/00* (2006.01)
*B32B 37/18* (2006.01)
*B32B 38/00* (2006.01)
*B05B 12/22* (2018.01)
*H01L 51/50* (2006.01)

(52) U.S. Cl.
CPC ........ *B32B 37/182* (2013.01); *B32B 38/0008* (2013.01); *C23C 14/042* (2013.01); *H01L 51/0011* (2013.01); *H01L 51/56* (2013.01); *B32B 2310/0843* (2013.01); *B32B 2311/00* (2013.01); *B32B 2398/00* (2013.01); *H01L 51/5012* (2013.01)

(56) References Cited

U.S. PATENT DOCUMENTS

| | | |
|---|---|---|
| 6,633,124 B2 | 10/2003 | Himeshima et al. |
| 6,858,086 B2 | 2/2005 | Kang |
| 7,268,406 B2 | 9/2007 | Yotsuya et al. |
| 8,151,729 B2 | 4/2012 | Ko |
| 9,108,216 B2 | 8/2015 | Hirobe et al. |
| 9,203,028 B2 | 12/2015 | Takeda |
| 9,441,288 B2 | 9/2016 | Sung et al. |
| 9,527,098 B2 | 12/2016 | Hirobe et al. |
| 2002/0102754 A1 | 8/2002 | Fujimori et al. |
| 2003/0101932 A1 | 6/2003 | Kang |
| 2004/0202821 A1 | 10/2004 | Kim et al. |
| 2007/0017895 A1 | 1/2007 | Yotsuya et al. |
| 2007/0148337 A1 | 6/2007 | Nichols et al. |
| 2008/0038935 A1 | 2/2008 | Baude et al. |
| 2008/0261403 A1 | 10/2008 | Wang et al. |
| 2008/0314743 A1 | 12/2008 | Lee et al. |
| 2009/0229638 A1 | 9/2009 | Yun et al. |
| 2010/0021119 A1 | 1/2010 | Ohtsu et al. |
| 2012/0187399 A1 | 7/2012 | Fukuda et al. |
| 2013/0015444 A1 | 1/2013 | Hirai |
| 2013/0064969 A1 | 3/2013 | Inoue et al. |
| 2014/0146391 A1 | 5/2014 | Jang et al. |
| 2014/0199808 A1 | 7/2014 | Sugimoto et al. |
| 2014/0377903 A1 | 12/2014 | Tadeda et al. |
| 2015/0017759 A1 | 1/2015 | Hirobe et al. |
| 2015/0037928 A1 | 2/2015 | Hirobe et al. |

FOREIGN PATENT DOCUMENTS

| | | |
|---|---|---|
| CN | 1642374 A | 7/2005 |
| CN | 101290908 A | 10/2008 |
| JP | 63-076859 A1 | 4/1988 |
| JP | 07-300664 A1 | 11/1995 |
| JP | 2002-235166 A1 | 8/2002 |
| JP | 2002-305080 A1 | 10/2002 |
| JP | 2003-217850 A | 7/2003 |
| JP | 2003-332057 A1 | 11/2003 |
| JP | 2004-190057 A1 | 7/2004 |
| JP | 2005-174843 A | 6/2005 |
| JP | 2008-121060 A1 | 5/2008 |
| JP | 2008-274373 A | 11/2008 |
| JP | 2009-001895 A1 | 1/2009 |
| JP | 2009-041054 A | 2/2009 |
| JP | 2009-287113 A | 12/2009 |
| JP | 2010-062125 A | 3/2010 |
| JP | 2010-216012 A | 9/2010 |
| JP | 2010-261081 A | 11/2010 |
| JP | 2011-161454 A | 8/2011 |
| JP | 2012-015463 A | 1/2012 |
| JP | 2013-021165 A | 1/2013 |
| JP | 2013-077541 A1 | 4/2013 |
| JP | 2013-083704 A1 | 5/2013 |
| JP | 2013-084373 A1 | 5/2013 |
| JP | 2013-095993 A1 | 5/2013 |
| JP | 2013-108143 A | 6/2013 |
| JP | 2013-124372 A1 | 6/2013 |
| TW | 200632541 A | 9/2006 |
| TW | 200718268 A | 5/2007 |
| TW | 201126723 A | 8/2011 |
| TW | 201345313 A | 11/2013 |
| WO | 2006/067836 A1 | 6/2006 |
| WO | 2011/148750 A1 | 12/2011 |

OTHER PUBLICATIONS

Taiwanese Office Action (Application No. 104124249) dated Apr. 13, 2016.
Japanese Office Action (Application No. 2013-117238) dated Aug. 23, 2016 (with English translation).
Chinese Office Action (Application No. 201510676232.3) dated May 4, 2017 (with English translation).
Chinese Office Action (Application No. 201610206229.X) dated Aug. 21, 2018 (with English translation).
Japanese Office Action (Application No. 2017-238107) dated Aug. 21, 2018 (with English translation).

VAPOR DEPOSITION MASK WITH METAL PLATE

CROSS REFERENCE TO RELATED APPLICATIONS

This application in a continuation of U.S. application Ser. No. 15/214,808, filed Jul. 20, 2016, which is a continuation of U.S. application Ser. No. 14/719,355, filed May 22, 2015, now U.S. Pat. No. 9,527,098, issued Dec. 27, 2016, which in turn is a division of Ser. No. 14/371,670, filed Jul. 10, 2014, now U.S. Pat. No. 9,108,216, issued Aug. 18, 2015, which in turn is the national stage entry of International Application No. PCT/JP2013/050422, filed Jan. 11, 2013, which designated the United States, the entireties of which are incorporated herein by reference.

FIELD OF THE INVENTION

The present invention relates to a vapor deposition mask, a method for producing a vapor deposition mask device and a method for producing an organic semiconductor element.

BACKGROUND OF THE INVENTION

Conventionally, in production of an organic EL element, a vapor deposition mask that is composed of a metal formed by a number of microscopic slits being arranged in parallel with one another at microscopic spaces in a region that should be subjected to vapor deposition, for example, has been used in formation of an organic layer of an organic EL element or a cathode electrode. While in the case of using the vapor deposition mask, the vapor deposition mask is placed on a substrate front surface that should be subjected to vapor deposition and is held by using a magnet from a back surface, the rigidity of the slits is extremely small, and therefore, distortion easily occurs to the slits when the vapor deposition mask is held on the substrate front surface, which becomes an obstacle to enhancement in definition or upsizing of the products in which the slit lengths are large.

Various studies have been made on the vapor deposition masks for preventing distortion of slits, and, for example, Patent Literature 1 proposes a vapor deposition mask including a base plate that also serves a first metal mask including a plurality of openings, a second metal mask including a number of microscopic slits in regions to cover the aforementioned openings, and a mask pulling and holding device that positions the second metal mask on the base plate in a state in which the second metal mask is pulled in the longitudinal direction of the slits. Namely, the vapor deposition mask with two kinds of metal masks being combined is proposed. It is indicated that according to the vapor deposition mask, slit precision can be ensured without occurrence of distortion to the slits.

Incidentally, in recent years, with upsizing of the products using organic EL elements or increase in substrate sizes, a demand for upsizing are also growing with respect to vapor deposition masks, and the metal plates for use in production of the vapor deposition masks composed of metals are also upsized. However, with the present metal processing technique, it is difficult to form slits in a large metal plate with high precision, and even if distortion in slit portions can be prevented by the method proposed in the above described Patent Literature 1 or the like, the method or the like cannot respond to enhancement in definition of the slits. Further, in the case of use of a vapor deposition mask composed of only a metal, the mass thereof also increases with upsizing, and the total mass including a frame also increases, which becomes a hindrance to handling.

CITATION LIST

Patent Literature

Patent Literature 1: Japanese Patent Laid-Open No. 2003-332057

SUMMARY OF THE INVENTION

The present invention is made in the light of the situation as above, and addresses the main problems of providing a vapor deposition mask capable of satisfying both enhancement in definition and reduction in weight even when a size is increased, providing a method for producing a vapor deposition mask device capable of aligning the vapor deposition mask with a frame with high precision, and further providing a method for producing an organic semiconductor element capable of producing an organic semiconductor element with high precision.

The present invention for solving the above described problem is a vapor deposition mask, wherein a metal mask provided with a slit, and a resin mask that is positioned on a front surface of the metal mask, and has openings corresponding to a pattern to be produced by vapor deposition arranged by lengthwise and crosswise in a plurality of rows, are stacked.

Further, the aforementioned metal mask may be of a magnetic substance. Further, a sectional shape of the opening may have broadening toward a vapor deposition source direction. A sectional shape of the slit may have broadening toward the vapor deposition source direction. Further, a sectional shape of an entire opening formed by the slit of the metal mask and the opening of the resin mask presents a step shape.

Further, a barrier layer may be provided on end surfaces that form the opening of the resin mask. Further, a thickness of the resin mask may be 3 μm to 25 μm inclusive.

The present invention for solving the above described problems is a method for producing a vapor deposition mask device, and includes the steps of bonding a metal mask provided with a slit and a resin plate to each other, fixing the metal mask to which the resin plate is bonded, onto a frame containing a metal, and forming openings corresponding to a pattern to be produced by vapor deposition in a plurality of rows lengthwise and crosswise in the resin plate by emitting laser from the metal mask side.

Further, the present invention for solving the above described problems is a method for producing a vapor deposition mask device, and includes the steps of fixing a metal mask provided with a slit onto a frame containing a metal, bonding the metal mask fixed to the frame and a resin plate to each other, and forming openings corresponding to a pattern to be produced by vapor deposition in a plurality of rows lengthwise and crosswise in the resin plate by emitting laser from the metal mask side.

Further, the present invention for solving the above described problem is a method for producing an organic semiconductor element, wherein the vapor deposition mask having the above described features is used.

According to the vapor deposition mask of the present invention, even when the size is increased, both enhancement in definition and reduction in weight can be satisfied. Further, according to the method for producing a vapor deposition mask device of the present invention, the above described vapor deposition mask can be aligned to the frame with high precision, in addition to the effect of the above described vapor deposition mask. Further, according to the method for producing an organic semiconductor element of the present invention, an organic semiconductor element can be produced with high precision.

DETAILED DESCRIPTION OF THE INVENTION

Hereinafter, the vapor deposition mask 100 of the present invention will be described specifically with use of the drawings.

Figure 1:
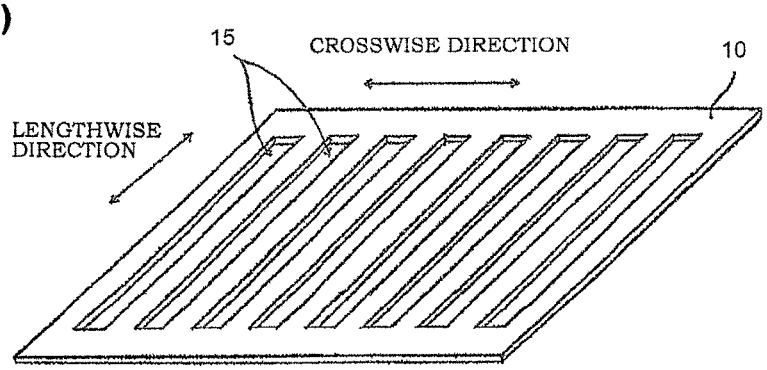
FIGS. 1 (a)-(b) are schematic perspective views that show a metal mask and a resin mask of a vapor deposition mask showing one example of the present invention by exploding the vapor deposition mask, FIG. 1 (a) is a schematic perspective view of a metal mask, and FIG. 1 (b) is a schematic perspective view of a resin mask.
Figure 1:
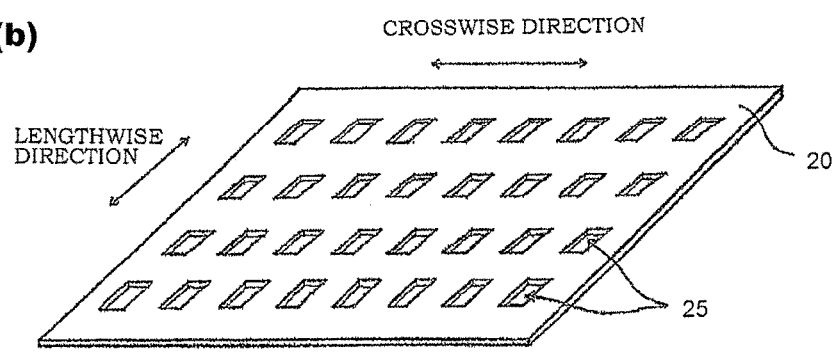
Figure 2:
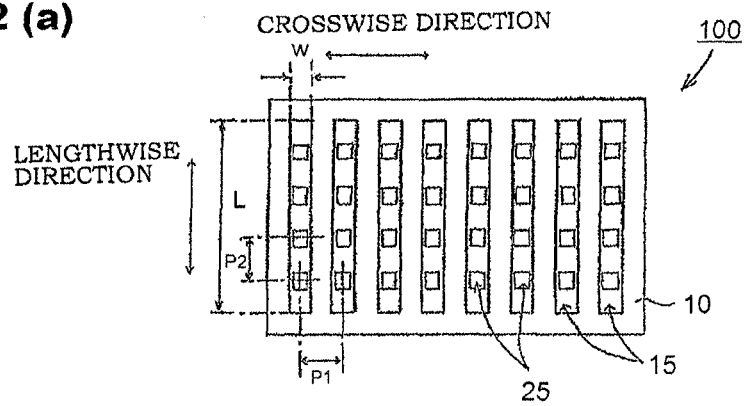
FIGS. 2 (a), (c) and (d) are front views of the vapor deposition mask showing one example of the present invention, seen from a metal mask side, and FIG. 2 (b) is a schematic sectional view showing the vapor deposition mask showing one example of the present invention.
Figure 2:
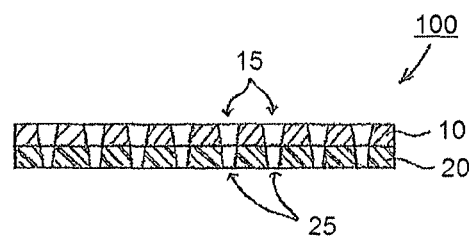
Figure 2:
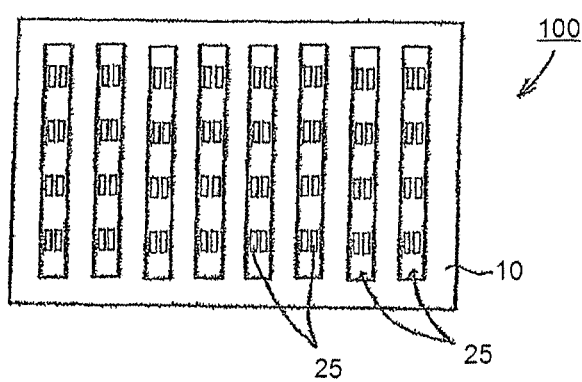
Figure 2:
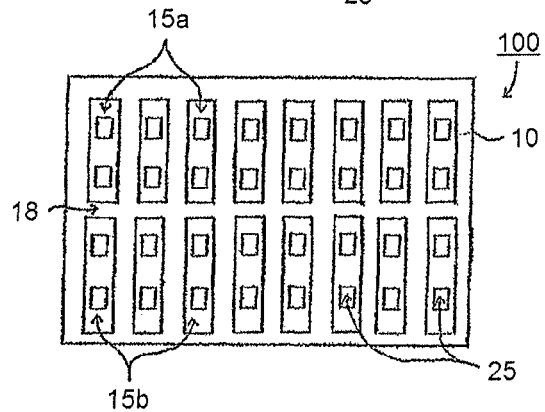
Figure 3:
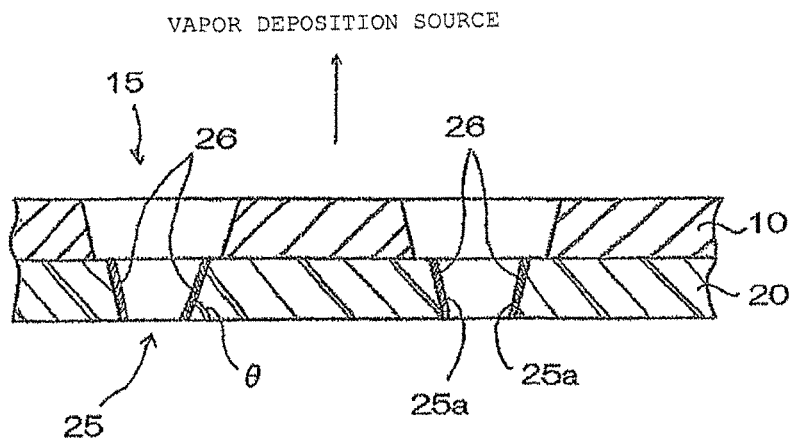
FIG. 3 is an enlarged sectional view of the vapor deposition mask 100 of the present invention.

FIG. 1 (a) is a schematic perspective view of a metal mask configuring a vapor deposition mask showing one example of the present invention, and FIG. 1 (b) is a schematic perspective view of a resin mask configuring the vapor deposition mask showing one example of the present invention. FIG. 2 (a) is a front view of the vapor deposition mask showing one example of the present invention, seen from a metal mask side, and FIG. 2 (b) is a schematic sectional view showing the vapor deposition mask showing one example of the present invention. FIG. 3 is an enlarged sectional view of the vapor deposition mask 100 of the present invention. Note that in each of FIGS. 1 to 3, in order to emphasize slits provided in the metal mask and openings provided in the vapor deposition mask, the ratios thereof to the whole body are illustrated to be large.

In the vapor deposition mask 100 of the present invention, the configuration is adopted, in which a metal mask 10 provided with slits 15, and a resin mask 20 which is positioned on one surface of the metal mask 10 (an undersurface of the metal mask 10 in a case shown in FIG. 2 (b)), and has openings 25 corresponding to a pattern to be produced by vapor deposition arranged by lengthwise and crosswise in a plurality of rows, are stacked, as shown in FIGS. 1 and 2.

Here, when a mass of the vapor deposition mask 100 of the present invention, and a mass of the vapor deposition mask that is composed of only a metal and is conventionally known are compared on the assumption that thicknesses of the entire vapor deposition masks are the same, the mass of the vapor deposition mask 100 of the present invention is lighter by an amount of a part of the metal material of the conventionally known vapor deposition mask, which is replaced with a resin material. Further, in order to reduce weight by using the vapor deposition mask composed of only a metal, it is necessary to reduce the thickness of the vapor deposition mask, but when the thickness of the vapor deposition mask is reduced, distortion sometimes occurs to the vapor deposition mask, and reduction in durability sometimes occurs when upsizing the vapor deposition mask. Meanwhile, according to the vapor deposition mask according to the present invention, even when the thickness of the entire vapor deposition mask is increased to satisfy distortion and durability at the time of the mask being upsized, reduction in weight can be achieved more than the vapor deposition mask that is formed of only a metal by the presence of the resin mask 20. Hereinafter, respective members will be described specifically.

Resin Mask

The resin mask 20 is composed of a resin, and as shown in FIGS. 1 and 2, the openings 25 corresponding to a pattern to be produced by vapor deposition are arranged by lengthwise and crosswise in a plurality of rows at the position overlapping the slit 15. Note that the pattern to be produced by vapor deposition in the description of the present application means the pattern to be produced by using the vapor deposition mask, and, for example, when the vapor deposition mask is used in formation of an organic layer of an organic EL element, the pattern is in a shape of the organic layer. Further, in the present invention, the example in which the openings are arranged by lengthwise and crosswise in a plurality of rows is cited and described, but the openings 25 can be provided at positions overlapping the slits, and when the slits 15 are arranged in only a single row in the lengthwise direction, or the crosswise direction, the openings 25 can be provided at the position overlapping the slit 15 in the single row.

For the resin mask 20, a conventionally known resin material can be properly selected and used, and while the material is not especially limited, a material that enables formation of the opening 25 with high definition by laser processing or the like, has a low rate of dimensional change and a low rate of humidity absorption under heat and with passage of time, and is lightweight, is preferably used. As such materials, a polyimide resin, a polyamide resin, a polyamide-imide resin, a polyester resin, a polyethylene resin, a polyvinylalcohol resin, a polypropylene resin, a polycarbonate resin, a polystyrene resin, a polyacrylonitrile resin, an ethylene-vinyl acetate copolymer resin, an ethylene-vinyl alcohol copolymer resin, an ethylene-methacrylic acid copolymer resin, a polyvinyl chloride resin, a polyvinylidene chloride resin, cellophane, an ionomer resin and the like can be cited. Among the materials illustrated in the above, the resin materials with the thermal expansion coefficients of 16 ppm/° C. or less are preferable, the resin materials with rates of humidity absorption of 1.0% or less are preferable, and the resin materials including both the conditions are especially preferable. In the present invention, the resin mask 20 is composed of the resin material that enables formation of the openings 25 with high definition as compared with the metal material as described above. Accordingly, the vapor deposition mask 100 having the openings 25 with high definition can be provided.

While the thickness of the resin mask 20 is not especially limited, the resin mask 20 is preferably as thin as possible in order to prevent occurrence of an insufficient vapor deposition portion, namely, a vapor deposition portion with a film thickness smaller than the intended vapor deposition film thickness, a so-called shadow, in the pattern that is produced by vapor deposition, when vapor deposition is performed with use of the vapor deposition mask 100 of the present invention. However, when the thickness of the resin mask 20 is less than 3 μm, a defect such as a pinhole easily occurs, and the risk of deformation or the like increases. Meanwhile, when the thickness of the resin mask 20 exceeds 25 μm, generation of a shadow can arise. With this point taken into consideration, the thickness of the resin mask 20 is preferably from 3 μm to 25μ inclusive. By setting the thickness of the resin mask 20 within this range, the defect such as a pinhole and the risk of deformation or the like can be reduced, and generation of a shadow can be effectively prevented. In particular, the thickness of the resin mask 20 is set to be from 3 μm to 10 μm inclusive, more preferably, from 4 μm to 8 μm inclusive, whereby the influence of a shadow at the time of forming a high-definition pattern exceeding 300 ppi can be prevented more effectively. Note that in the vapor deposition mask 100 of the present invention, the metal mask 10 and the resin mask 20 may be directly bonded, or may be bonded via an adhesive layer, and when the metal mask 10 and the resin mask 20 are bonded via the adhesive layer, the total thickness of the resin mask 20 and the adhesive layer is preferably set to be within a range from 3 μm to 25 μm inclusive, preferably from 3 μm to 10 μm inclusive, and more preferably, from 4 μm to 8 μm inclusive.

The shape and the size of the opening 25 are not especially limited, and can be the shape and the size corresponding to the pattern to be produced by vapor deposition. Further, as shown in FIG. 2 (*a*), a pitch P1 in a crosswise direction of the adjacent openings 25, and a pitch P2 in a lengthwise direction can be also properly set in accordance with the pattern to be produced by vapor deposition.

The positions at which the openings 25 are provided and the number of the openings 25 are not specially limited, and a single opening 25 may be provided at a position overlapping the slit 15, or a plurality of openings 25 may be provided in the lengthwise direction, or the crosswise direction. For example, as shown in FIG. 2 (*c*), when the slit extends in the lengthwise direction, two or more of the openings 25 that overlap the slit 15 may be provided in the crosswise direction.

A sectional shape of the opening 25 is not specially limited, and end surfaces that face each other of the resin mask forming the opening 25 may be substantially parallel with each other, but the sectional shape of the opening 25 is preferably is the shape having broadening toward a vapor deposition source as shown in FIG. 2 (*b*) and FIG. 3. In other words, the sectional shape of the opening 25 preferably has a taper surface having broadening toward the metal mask 10 side. By making the sectional shape of the opening 25 have the above configuration, a shadow can be prevented from being generated in the pattern that is produced by vapor deposition when vapor deposition is performed with use of the vapor deposition mask of the present invention. While a taper angle θ shown in FIG. 4 can be properly set with the thickness or the like of the resin mask 20 taken into consideration, an angle (θ) connecting a lower bottom distal end in the opening of the resin mask and an upper bottom distal end in the opening of the same resin mask is preferably within a range from 25° to 65°. In particular, within this range, the angle (θ) is preferably an angle smaller than a vapor deposition angle of a vapor deposition machine to be used. Furthermore, in FIG. 2 (*b*) and FIG. 3, an end surface 25*a* that forms the opening 25 shows a linear shape, but the end surface 25*a* is not limited thereto, and may be in a curved shape protruding outward, namely, a shape of the entire opening 25 may be in a bowl shape. The opening 25 that has the sectional shape like this can be formed by performing multistage laser irradiation that properly adjusts the irradiation position of the laser and irradiation energy of the laser at the time of formation of the opening 25, or changes the irradiation position stepwise, for example.

Since a resin material is used for the resin mask 20, formation of the opening 25 is enabled without using the processing methods that are used in the conventional metal processing, for example, the processing methods such as etching processing method and cutting. Namely, the method for forming the opening 25 is not specially limited, and the opening 25 can be formed by using various processing methods, for example, a laser processing method capable of forming the opening 25 with high definition, precision press processing, photolithography processing and the like. The method for forming the opening 25 by a laser processing method or the like will be described later.

As the etching processing method, for example, a wet etching method such as a spray etching method that sprays an etching agent at a predetermined spray pressure from an injection nozzle, an immersion etching method that immerses an object in an etching solution filled with an etching agent, and a spin etching method that drops an etching agent, and a dry etching method using gas, plasma and the like can be used.

Further, in the present invention, as the configuration of the vapor deposition mask 100, the resin mask 20 is used. Therefore, when vapor deposition is performed with use of the vapor deposition mask 100, very high heat is applied to the openings 25 of the resin mask 20, and the risk of a gas being generated from end surfaces 25*a* (see FIG. 3) that form the opening 25 of the resin mask 20 to reduce the degree of vacuum in the vapor deposition apparatus or the like can arise. Accordingly, with this point taken into consideration, the end surfaces 25*a* that form the opening 25 of the resin mask 20 are preferably provided with a barrier layer 26. By forming the barrier layer 26, a gas can be prevented from being generated from the end surfaces 25*a* that form the opening 25 of the resin mask 20.

As the barrier layer 26, a thin film layer or a vapor deposition layer of an inorganic oxide, an inorganic nitride or a metal can be used. As an inorganic oxide, oxides of aluminum, silicon, indium, tin and magnesium can be used, and as a metal, aluminum or the like can be used. A thickness of the barrier layer 26 is preferably around 0.05 μm to 1 μm.

Furthermore, the barrier layer preferably covers a front surface at the vapor deposition source side, of the resin mask 20. The front surface at the vapor deposition source side, of the resin mask 20 is covered with the barrier layer 26, whereby a barrier property thereof is further enhanced. The barrier layer is preferably formed by various PVD methods and CVD methods in the case of an inorganic oxide and an inorganic nitride. In the case of a metal, the barrier layer is preferably formed by a vacuum vapor deposition method. Note that the front surface at the vapor deposition source side, of the resin mask 20 mentioned here may be the entire front surface at the vapor deposition source side, of the resin mask 20, or may be only portions exposed from the metal mask in the front surface at the vapor deposition source side, of the resin mask 20.

Figure 4:
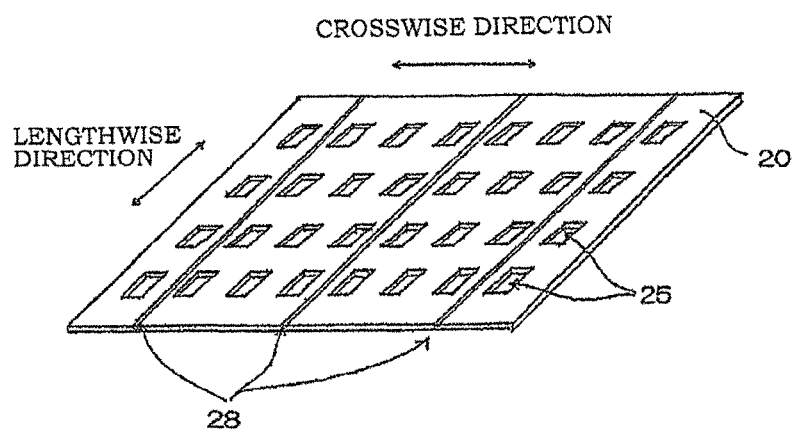
FIG. 4 (a) is a perspective view of another mode of the resin mask, and FIG. 4 (b) is a sectional view thereof.
Figure 4:
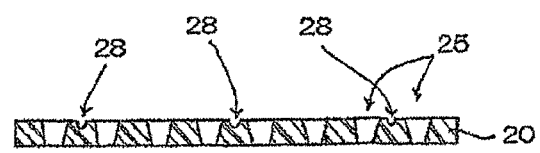

FIGS. 4 (a) is a perspective view of another mode of the resin mask, and (b) is a sectional view thereof.

As shown in FIG. 4, on the resin mask 20, grooves 28 that extend in the lengthwise direction or the crosswise direction (the lengthwise direction in the case of FIG. 4) of the resin mask 20 are preferably formed. When heat is applied at the time of vapor deposition, the resin mask 20 is thermally expanded, whereby the dimensions and positions of the opening 25 are likely to change. However, by forming the grooves 28, expansion of the resin mask can be absorbed, and the dimensions and the positions of the openings 25 can be prevented from changing as a result that the resin mask 20 expands in a predetermined direction as a whole by cumulative thermal expansion occurring at respective sites of the resin mask.

Note that in FIG. 4, the grooves 28 that extend in the crosswise direction are formed among the openings 25, but the groove 28 is not limited thereto, and grooves that extend in the crosswise direction may be formed among the openings 25. Furthermore, the positions are not limited to those among the openings 25, and the grooves may be formed at positions overlapping the openings 25. Furthermore, grooves may be formed in a mode of combination thereof.

A depth and a width of the groove 28 are not specially limited, but when the depth of the groove 28 is too deep, and the width is too large, rigidity of the resin mask 20 tends to be reduced, and therefore, the depth and the width need to be set with consideration given to this point. Further, a sectional shape of the groove is not specially limited, and can be optionally selected to be a U-shape, a V-shape or the like, with consideration given to the processing method or the like.

Metal Mask

The metal mask 10 is composed of a metal, and the slits 15 that extend in the lengthwise direction or the crosswise direction are arranged in a plurality of rows in the position overlapping the openings 25, in other words, in the position where all of the openings 25 arranged in the resin mask 20 are visible, when seen from a front of the metal mask 10. Note that in FIGS. 1 and 2, the slits 15 that extend in the lengthwise direction of the metal mask 10 are continuously arranged in the crosswise direction. Further, in the present invention, the example in which the slits 15 that extend in the lengthwise direction or the crosswise direction are arranged in a plurality of rows is cited and described, but the slits 15 may be arranged in only a single row in the lengthwise direction or in the crosswise direction.

While a width W of the slit 15 is not specially limited, the width W is preferably designed to be shorter than at least the pitch between the adjacent openings 25. More specifically, as shown in FIG. 2 (a), when the slit 15 extends in the lengthwise direction, the width W in the crosswise direction of the slit 15 is preferably made shorter than the pitch P1 of the openings 25 adjacent to each other in the crosswise direction. Similarly, though not illustrated, when the slit 15 extends in the crosswise direction, a width in the lengthwise direction of the slit 15 is preferably made shorter than a pitch P2 of the openings 25 adjacent to each other in the lengthwise direction. Meanwhile, a length L in the lengthwise direction in a case of the slit 15 extending in the lengthwise direction is not specially limited, and can be properly designed in accordance with the lengthwise length of the metal mask 10 and the positions of the openings 25 that are provided in the resin mask 20.

Further, the slit 15 that continuously extends in the lengthwise direction, or in the crosswise direction may be divided into a plurality of portions by a bridge 18. Note that FIG. 2 (d) is a front view of the vapor deposition mask 100 seen from the metal mask 10 side, and shows an example in which the single slit 15 continuously extending in the lengthwise direction shown in FIG. 2 (a) are divided into a plurality of portions (slits 15a and 15b) by the bridge 18. While a width of the bridge 18 is not specially limited, the width of the bridge 18 is preferably around 5 μm to 20 μm. By setting the width of the bridge 18 to be within this range, the rigidity of the metal mask 10 can be effectively enhanced. The arrangement position of the bridge 18 is not specially limited, but the bridge 18 is preferably arranged in such a manner that the slit after being divided is overlaid on the two or more of the openings 25.

While a sectional shape of the slit 15 that is formed in the metal mask 10 is not specially limited, either, the sectional shape is preferably a shape that has broadening toward the vapor deposition source as shown in FIG. 3, similarly to the opening 25 in the above described resin mask 20.

The material of the metal mask 10 is not specially limited, and the conventionally known material in the field of the vapor deposition mask can be properly selected and used, and, for example, a metal material such as stainless steel, an iron-nickel alloy, and an aluminum alloy can be cited. Above all, an invar material that is an iron-nickel alloy can be preferably used since an invar material is hardly deformed by heat.

Further, when the vapor deposition mask 100 at a front side of the substrate needs to be attracted by a magnetic force by arranging a magnet or the like at a rear side of the substrate when vapor deposition is performed onto the substrate with use of the vapor deposition mask 100 of the present invention, the metal mask 10 is preferably formed of a magnetic substance. As the metal mask 10 of a magnetic substance, pure iron, carbon steel, W steel, Cr steel, Co steel, KS steel, MK steel, NKS steel, Cunico steel, an AL-Fe alloy and the like can be cited. Further, when the material itself that forms the metal mask 10 is not of a magnetic substance, magnetism may be given to the metal mask 10 by dispersing powder of the above described magnetic substance into the material.

While the thickness of the metal mask 10 is not specially limited, the thickness is preferably around 5 μm to 100 μm. In the case of consideration being given to prevention of a shadow at the time of vapor deposition, the thickness of the metal mask 10 is preferably small, but when the thickness of the metal mask 10 is made thinner than 5 μm, the risk of breakage and deformation is increased, and handling is likely to be difficult. However, since in the present invention, the metal mask 10 is integrated with the resin mask 20, the risks of breakage and deformation can be reduced even if the thickness of the metal mask 10 is very small such as 5 μm, and a metal mask is usable if the thickness thereof is 5 μm or more. Note that the case in which the thickness of the metal mask 10 is made larger than 100 μm is not preferable because generation of a shadow can arise.

Figure 8:
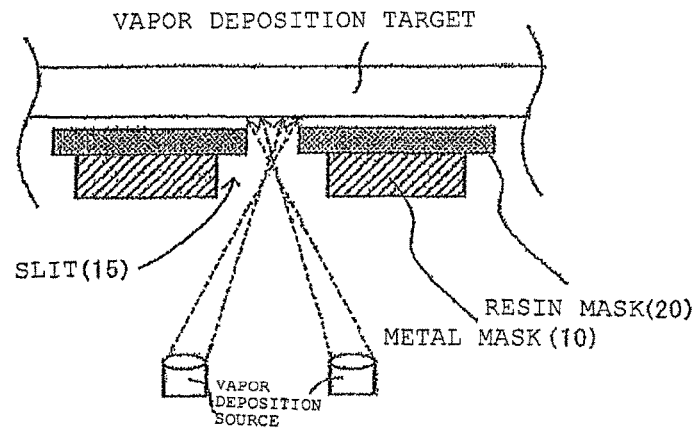
FIGS. 8 (a)-(c) are schematic sectional views showing a relation of a shadow and a thickness of the metal mask.
Figure 8:
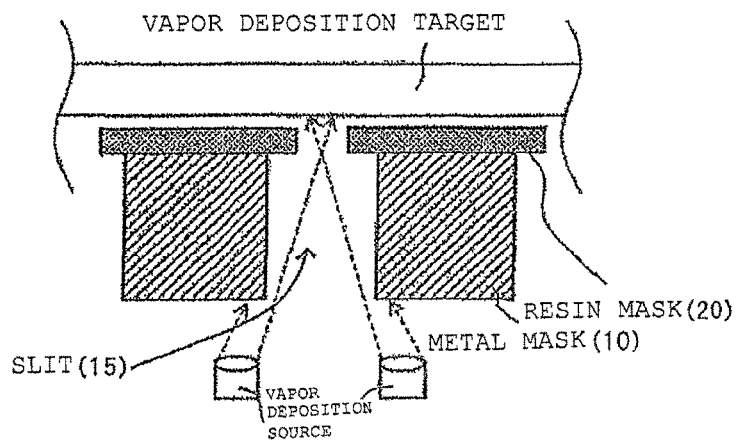
Figure 8:
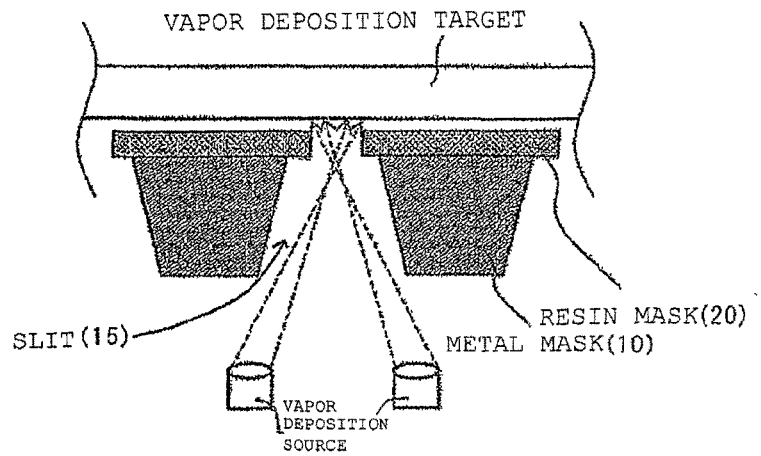

Hereinafter, with use of FIG. 8 (a) to FIG. 8 (c), a relation of generation of a shadow, and the thickness of the metal mask 10 will be specifically described. As shown in FIG. 8 (a), when the thickness of the metal mask 10 is small, the vapor deposition material that is released toward a vapor deposition target from a vapor deposition source passes through the slit 15 of the metal mask 10 and the opening 25 of the resin mask 20 without colliding with an inner wall surface of the slit 15 of the metal mask 10 and a surface of the metal mask 10 at a side where the resin mask 20 is not provided, and reaches the vapor deposition target. Thereby, formation of the vapor deposition pattern with a uniform film thickness onto the vapor deposition target is enabled. Namely, generation of a shadow can be prevented. Meanwhile, as shown in FIG. 8 (b), when the thickness of the metal mask 10 is large, for example, when the thickness of the metal mask 10 is a thickness exceeding 100 µm, a part of the vapor deposition material that is released from the vapor deposition source collides with the inner wall surfaces of the slit 15 of the metal mask 10, and the surface of the metal mask 10 at the side where the resin mask 20 is not formed, and cannot reach the vapor deposition target. As the vapor deposition material that cannot reach the vapor deposition target increases more, an undeposited portion having a film thickness smaller than the intended vapor deposition film thickness occurs to the vapor deposition target more, namely, a shadow is generated.

In order to prevent generation of a shadow sufficiently, the sectional shape of the slit 15 is preferably made a shape having broadening toward the vapor deposition source, as shown in FIG. 8 (c). By adopting the sectional shape like this, the vapor deposition material can be caused to reach the vapor deposition target without the vapor deposition material that is released from the vapor deposition source colliding with the surface of the slit 15 and the inner wall surface of the slit 15 even if the thickness of the entire vapor deposition mask is made large with the objective of prevention of distortion that can occur to the vapor deposition mask 100, or enhancement of durability. More specifically, the angle that is formed by a straight line connecting the lower bottom distal end in the slit 15 of the metal mask 10 and the upper bottom distal end in the slit 15 of the same metal mask 10, and the bottom surface of the metal mask 10 is preferably within a range of 25° to 65°. In particular, in this range, an angle that is smaller than the vapor deposition angle of the vapor deposition machine to be used is preferable. By adopting the sectional shape like this, the deposition material can be caused to reach the vapor deposition target without the vapor deposition material released from the vapor deposition source colliding with the inner wall surface of the slit 15 even when the thickness of the metal mask 10 is made relatively large with the objective of prevention of distortion that can arise in the vapor deposition mask 100, or enhancement of durability. Thereby, generation of a shadow can be prevented more effectively. Note that FIG. 8 is a partial schematic sectional view for explaining the relation of generation of a shadow and the slit 15 of the metal mask 10. Note that in FIG. 8 (c), the slit 15 of the metal mask 10 has the sectional shape having broadening toward the vapor deposition source side, and the end surfaces that face each other of the opening 25 of the resin mask 20 are substantially parallel with each other, but in order to prevent generation of a shadow more effectively, the sectional shapes of both the slit of the metal mask 10 and the opening 25 of the resin mask 20 are preferably the shapes having broadening toward the vapor deposition source side.

Figure 5:
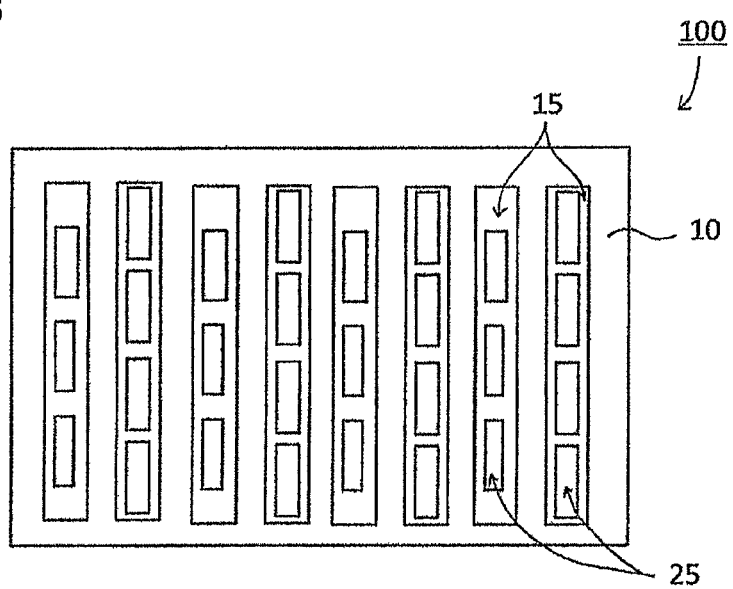
FIG. 5 is a front view showing another mode of the vapor deposition mask 100 of the present invention.

FIG. 5 is a front view showing another mode of the vapor deposition mask 100 of the present invention.

As shown in FIG. 5, in the front view of the vapor deposition mask 100 seen from the metal mask 10 side, the openings 25 that are formed in the resin mask 20 visible from the slits 15 of the metal mask may be arranged in a staggered configuration in the crosswise direction. Namely, the openings 25 that are adjacent with each other in the crosswise direction may be arranged by being displaced from each other in the lengthwise direction. By arranging the openings 25 as above, even when the resin mask 20 is thermally expanded, expansion that occurs in each site can be absorbed by the openings 25, and generation of large deformation due to accumulation of expansion can be prevented.

Further, as shown in FIG. 5, the opening 25 that is formed in the resin mask 20 does not have to correspond to one pixel, and two pixels to ten pixels may be collected to be a single opening 25, for example.

Figure 9:
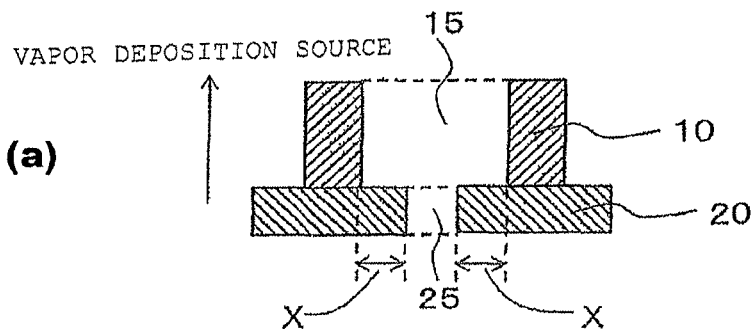
FIGS. 9 (a)-(d) are partial schematic sectional views showing a relation of a slit of the metal mask, and an opening of a resin mask.
Figure 9:
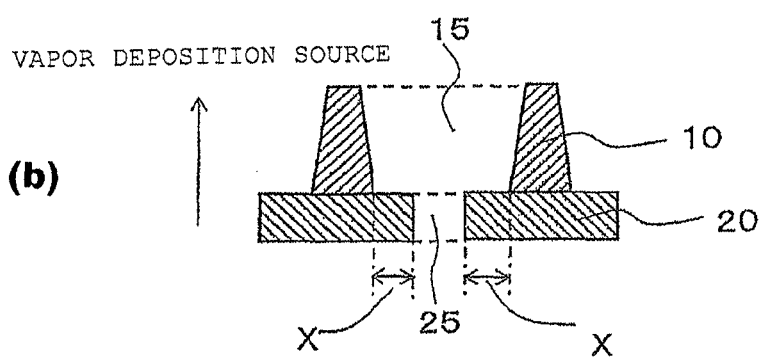
Figure 9:
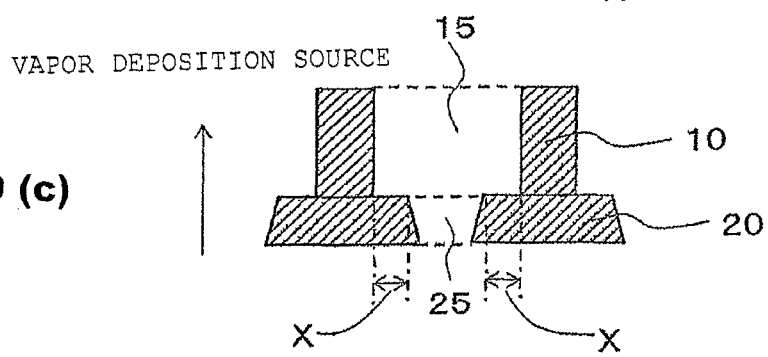
Figure 9:
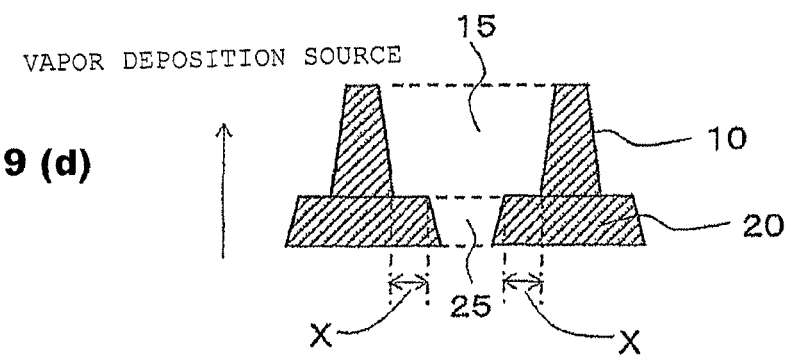

FIGS. 9 (a) to (d) are partial schematic sectional views showing the relation of the slit of the metal mask and the opening of the resin mask, and in the forms that are illustrated, the sectional shapes of entire openings that are formed by the slits 15 of the metal masks and the openings 25 of the resin masks show step shapes. As shown in FIG. 9, the sectional shapes of the entire openings are formed into step shapes having broadening toward the vapor deposition source sides, whereby generation of a shadow can be prevented effectively. In the sectional shapes of the slit 15 of the metal mask and the resin mask 20, the end surfaces that face each other may be substantially parallel with each other as shown in FIG. 9 (a), but as shown in FIGS. 9 (b) and (c), only any one of the slit 15 of the metal mask and the opening of the resin mask may have a sectional shape having broadening toward the vapor deposition source side. Note that as described in the above, in order to prevent generation of a shadow more effectively, both of the slit 15 of the metal mask, and the opening 25 of the resin mask preferably have the sectional shapes having broadening toward the vapor deposition source side as shown in FIG. 3 and FIG. 9 (d).

A width of a flat portion (reference sign (X) in FIG. 9) in the section formed into the above described step shape is not specially limited, but when the width of the flat portion (X) is less than 1 µm, the effect of prevention of shadow generation tends to reduce due to interference of the slit of the metal mask. Accordingly, with this point taken into consideration, the width of the flat portion (X) is preferably 1 µm or more. A preferable upper limit value is not specially limited, and can be properly set with consideration given to the size of the opening of the resin mask, the space between the adjacent openings and the like, and as one example, the preferable upper limit value is approximately 20 µm.

Figure 10:
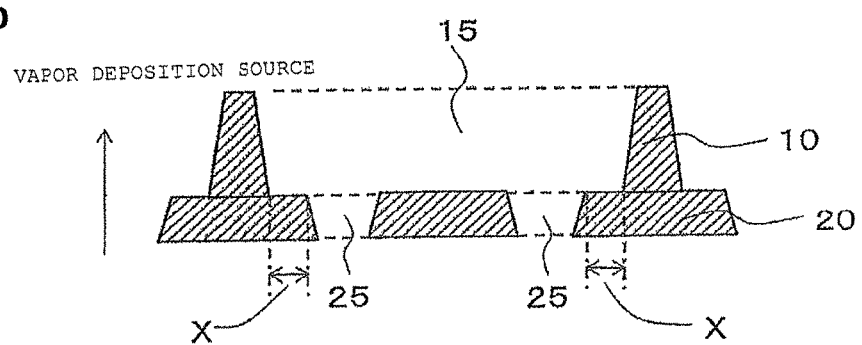
FIG. 10 is a partial schematic sectional view showing a relation of the slit of the metal mask and the opening of the resin mask.

Note that FIGS. 9 (a) to (d) described above each shows an example in which the single opening 25 that overlaps the slit 15 is provided in the crosswise direction when the slit extends in the lengthwise direction, but as shown in FIG. 10, two or more of the openings 25 that overlap the slit 15 may be provided in the crosswise direction when the slit extends in the lengthwise direction. In FIG. 10, both the slit 15 of the metal mask and the opening 25 of the resin mask have sectional shapes having broadening toward the vapor deposition source side, and two or more of the openings 25 that overlap the slit 15 are provided in the crosswise direction.

Method for Producing Vapor Deposition Mask

Next, a method for producing a vapor deposition mask device of the present invention will be described.

First Production Method

Figure 6:
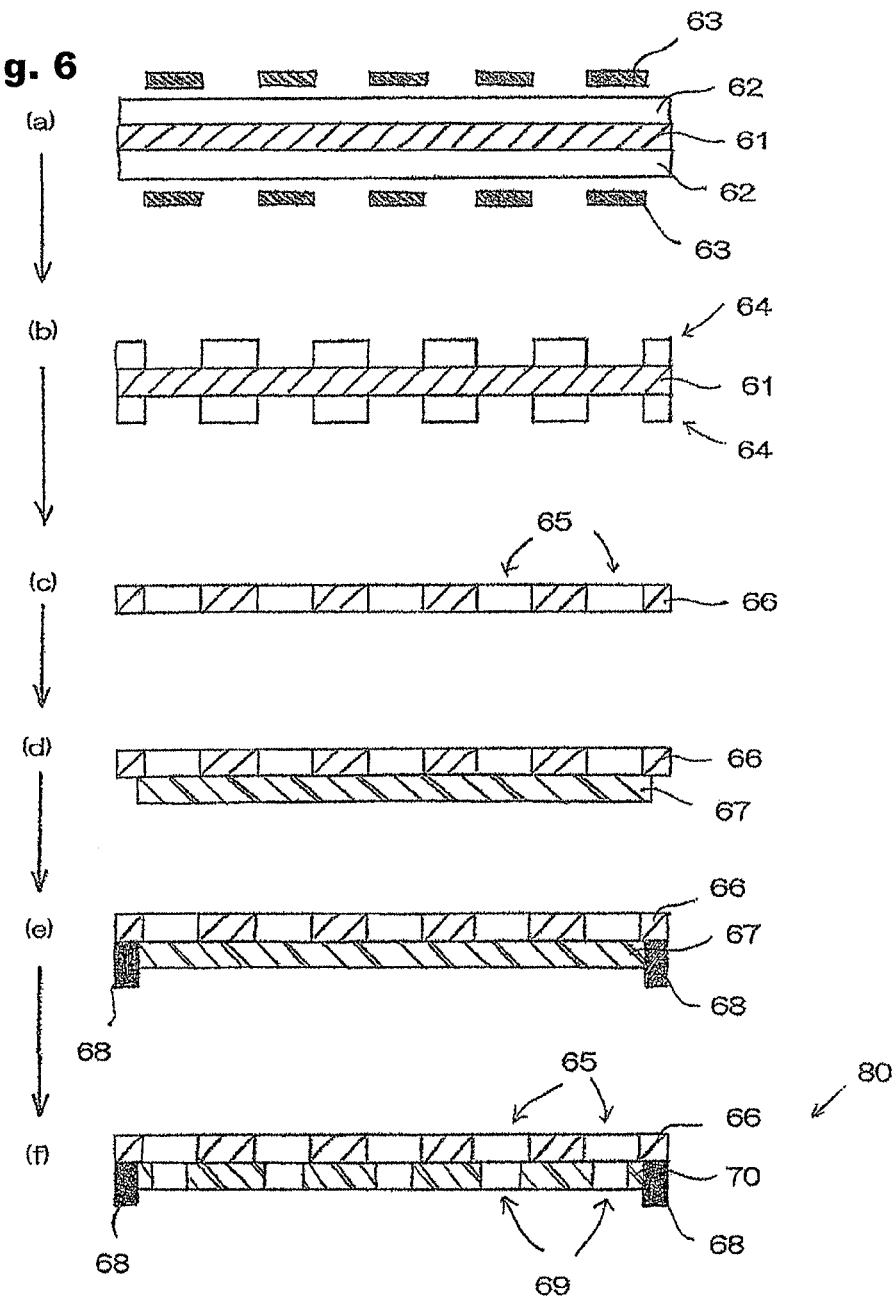
FIG. 6 is a process chart for describing a first production method. Note that (a) to (f) are all sectional views.

FIG. 6 is a process chart for describing a first production method. Note that (a) to (f) are all sectional views.

The first production method includes a step of bonding a metal mask provided with slits and a resin mask to each other, a step of fixing the metal mask to which the resin plate is bonded onto a frame containing a metal, and a step of forming openings corresponding to a pattern to be produced by vapor deposition in a plurality of rows lengthwise and crosswise in the resin plate by emitting laser from the metal mask side. The respective steps will be described hereinafter.

Step of Bonding Metal Mask Provided with Slits and Resin Plate

First, a metal mask provided with slits is prepared. In the present method, a method for producing the metal mask that is prepared is not specially limited, and a method that can form desired slits with high precision can be properly selected.

For example, as shown in FIG. 6 (a), the metal plate 61 is prepared, and both surfaces thereof are coated with a resist material 62. As the resist material for use, the resist material with high treatability and with desired resolution is used. Thereafter, the resist material 62 is masked with a mask 63 in which a slit pattern is formed, and is exposed by contact exposure, and is developed. Thereby, as shown in FIG. 6 (b), resist patterns 64 are formed on both the surfaces of the metal plate 61. Next, with use the resist patterns as etching resistant masks, etching processing is performed by a two-stage etching method. Note that the two-stage etching method refers to a processing method of forming through-holes by forming resist patterns on both surfaces of a metal plate, etching from one surface side is performed, thereafter, filling an etching resistant resin, a so-called backing material is filled in recessed portions that are formed and are not penetrated, and thereafter performing etching from the other surface side. In the present method, instead of a two-stage etching, a method that performs etching simultaneously from both surfaces may be adopted, but from the viewpoint of processing precision, a two-stage etching method is preferably used. When etching is finished, the resist patterns are cleaned and removed. Thereby, as shown in FIG. 6 (c), desired slits 65 are formed in the metal plate 61, and a metal mask 66 is obtained.

As shown in FIG. 6 (d), the metal mask 66 and a resin plate 67 are bonded to each other. A method thereof is not specially limited, and various tackiness agents may be used, or a resin plate having self-adhesiveness may be used, for example. Note that sizes of the metal mask 66 and the resin plate 67 may be the same, but with consideration given to fixation to the frame that is optionally performed thereafter, it is preferable to make the size of the resin plate 67 smaller than that of the metal mask 66, and keep an outer peripheral portion of the metal mask 66 in an exposed state.

Step of Fixing Metal Mask to which Aforementioned Resin Plate is Bonded, to Frame Containing Metal Next, as shown in FIG. 6 (e), to a frame 68 containing a metal, the metal mask 66 to which the resin plate 67 is bonded is fixed. In the present method, a fixing method is not limited, and, for example, a conventionally known step and method such as spot welding can be properly adopted.

Step of Forming Openings Corresponding to Pattern to be Produced by Vapor Deposition in a Plurality of Rows Lengthwise and Crosswise in Aforementioned Resin Plate by Emitting Laser from Metal Mask Side Next, openings 69 corresponding to a pattern to be produced by vapor deposition are formed in a plurality of rows lengthwise and crosswise in the aforementioned resin plate 67 by emitting laser through the slits 65 from the metal mask 66 side, and a resin mask 70 is made. The laser apparatus that is used here is not specially limited, and a conventionally known laser apparatus can be used. Thereby, a vapor deposition mask device 80 of the present invention as shown in FIG. 6 (f) is obtained.

Second Production Method

Figure 7:
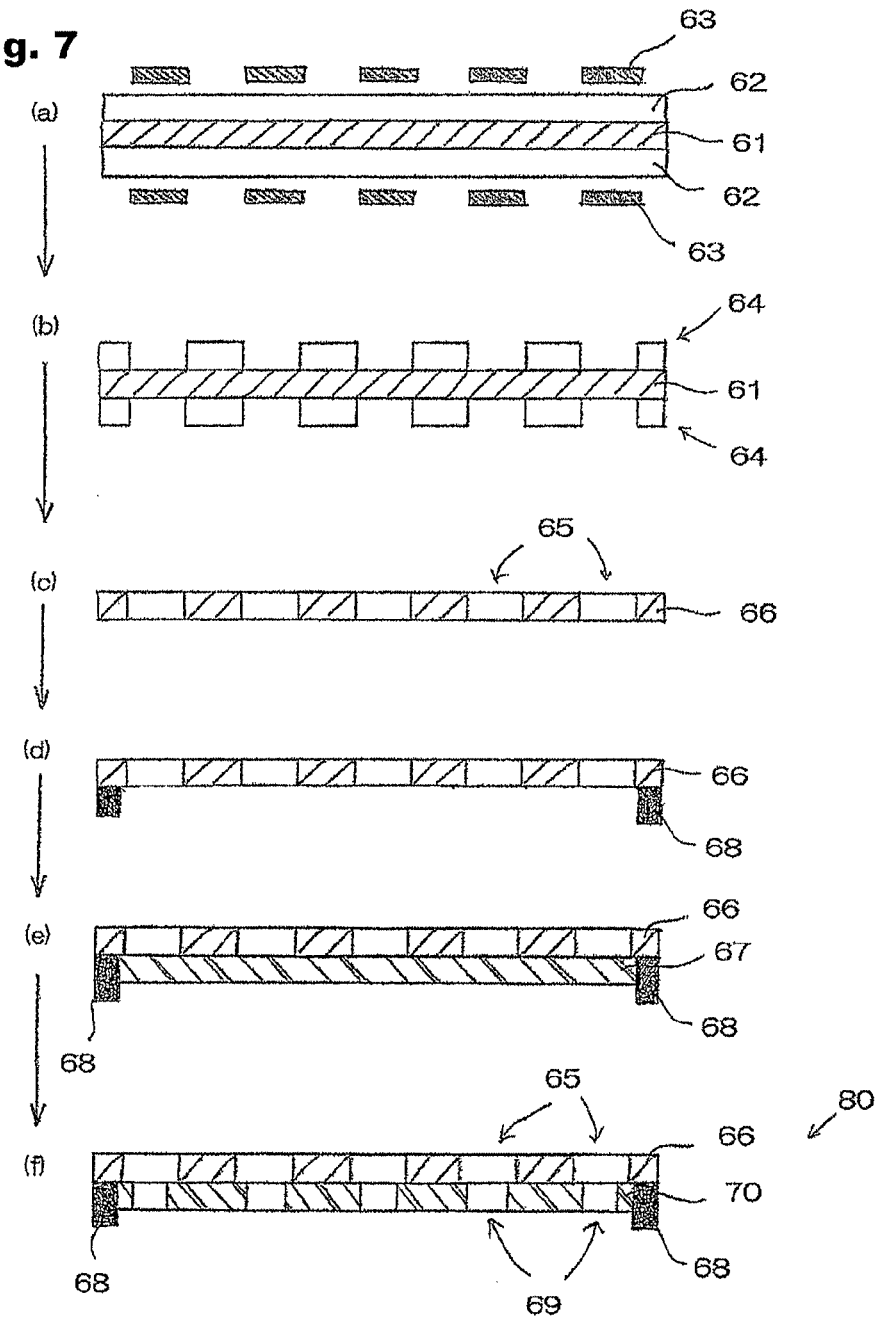
FIG. 7 is a process chart for describing a second production method. Note that (a) to (f) are all sectional views.

FIG. 7 is a process chart for describing a second production method. Note that (a) to (f) are all sectional views.

The second production method includes a step of fixing a metal mask provided with slits onto a frame containing a metal, a step of bonding the metal mask fixed to the frame and a resin plate to each other, and a step of forming openings corresponding to a pattern to be produced by vapor deposition in a plurality of rows lengthwise and crosswise in the aforementioned resin plate by emitting laser from the aforementioned metal mask side. Namely, in the first production method described in the above, the metal mask 66 and the resin plate 67 are bonded to each other, and thereafter, the metal mask 66 is fixed by means of the frame 68, whereas in the second production method, the metal mask 66 is fixed to the frame 68 first, and thereafter, the resin plate 67 is bonded.

Namely, in the second production method, the step of producing the metal mask 66 is the same as that in the aforementioned first production method as shown in FIGS. 7 (a) to (c), and after the completed metal mask 66 is fixed to the frame 68 containing a metal as shown in FIG. 7 (d), the metal mask 66 and the resin plate 67 are bonded to each other as shown in FIG. 7 (e). Thereafter, the step of providing the openings 65 in the resin plate 67 to make the vapor deposition mask device 80 is the same as in the aforementioned first production method as shown in FIG. 7 (f).

As above, according to the first and second production methods, in each of the production methods, the completed vapor deposition mask is not fixed to the frame, but the openings are provided later for the resin plate in the state fixed to the frame, and therefore, positional precision can be drastically enhanced. Note that in the conventionally known method, the metal mask in which the openings are set are fixed to the frame while being pulled, and therefore, precision of position coordinates of the openings is reduced.

Further, when providing the openings 25 to the resin plate in the state fixed to the frame, a reference sheet that is provided in advance with a pattern corresponding to the openings 25 to be formed may be prepared, and in a state in which the reference sheet is bonded to a surface of the resin plate at a side where the metal mask 66 is not provided, laser irradiation corresponding to the pattern on the reference sheet may be performed from the metal mask 10 side. According to the method, the openings 25 can be formed in a so-called face-to-face state in which laser irradiation is performed while the pattern on the reference sheet bonded to the resin plate is being watched, and the resin mask 20 having the openings 25 with high definition that have extremely high dimensional precision of the openings can be formed. Further, in this method, formation of the openings 25 is performed in the state fixed to the frame, the vapor deposition mask that is excellent in not only dimensional precision but also positional precision can be provided.

Note that in the case of using the above described method, it is necessary to be able to recognize the pattern on the reference sheet with a laser irradiator or the like through the resin plate from the metal mask 66 side. As the resin plate, use of the resin film material having transparency is necessary when the material has a certain degree of thickness, but when the resin film material has a preferable thickness with the influence on a shadow taken into consideration as described above, for example, a thickness of approximately 3 μm to 25 μm, the pattern on the reference sheet can be recognized even if the resin plate is colored.

A method for bonding the resin plate and the reference sheet is not specially limited, and when the metal mask 66 is a magnetic body, for example, a magnet or the like is arranged at a rear side of the reference sheet, and the resin plate and the reference sheet are bonded to each other by being attracted. Besides this, the resin film 200 and the reference sheet also can be bonded to each other with use of an electrostatic adsorbing method or the like. As the reference sheet, a TFT substrate having a predetermined opening pattern, a photo mask and the like can be cited, for example.

Slimming Step

Further, in the production method of the present invention, a slimming step may be performed between the steps described above, or after the steps. The step is an optional step in the production method of the present invention, and is the step of optimizing the thickness of the metal mask 66, and the thickness of the resin mask 70. The preferable thicknesses of the metal mask 66 and the resin mask 70 may be properly set in the above described ranges, and the detailed explanation here will be omitted.

For example, when the resin plate and the metal plate that are thicker than the preferable thicknesses described above are used as the resin plate 67 to be the resin mask 70, and the metal plate 61 to be the metal mask 66, excellent durability and transportability can be given when the metal plate 61 and the resin plate 67 are individually transported, when a layered body in which the resin plate 67 is provided on the metal plate 61 which is provided with recessed portions is transported, or when the vapor deposition mask 100 obtained in the above described step of forming the vapor deposition mask is transported, during the production process. Meanwhile, in order to prevent generation of a shadow or the like, the thicknesses of the vapor deposition mask 100 that is obtained according to the production method of the present invention is preferably the optimum thicknesses. The slimming step is a useful step in the case of optimizing the thickness of the vapor deposition mask 100 while satisfying durability and transportability during the production process or after the process.

Slimming of the metal plate 61 to be the metal mask 66 and the metal mask 66, namely, optimization of the thickness of the metal mask can be realized by etching the surface of the metal plate 61 at the side that is not in contact with the resin plate 67, or the surface of the metal mask 66 at the side that is not in contact with the resin plate 67 or the resin mask 20 by using the etching agent capable of etching the metal plate 61 and the metal mask 66, between the steps described above, or after the steps.

Slimming of the resin plate 67 to be the resin mask 70 and the resin mask 70, namely, optimization of the thicknesses of the resin plate 67 and the resin mask 70 is similar to the above, and can be realized by etching the surface of the resin plate 67 at the side that is not in contact with the metal plate 61 and the metal mask 66, or the surface of the resin mask 70 at the side that is not in contact with the metal mask 66 by using the etching agent capable of etching the materials of the resin plate 67 and the resin mask 70. Further, after the vapor deposition mask 100 is formed, both the metal mask 66 and the resin mask 70 are subjected to etching processing, whereby the thicknesses of both of them also can be optimized between the steps described above, or after the steps.

Method for Producing Organic Semiconductor Element

A method for producing an organic semiconductor element of the present invention is characterized by forming an organic semiconductor element by using the vapor deposition mask 100 of the present invention described in the above. As for the vapor deposition mask 100, the vapor deposition mask 100 of the present invention described above can be directly used, and therefore, the detailed explanation here will be omitted. According to the vapor deposition mask of the present invention described above, an organic semiconductor element having a pattern with high definition can be formed by the openings 25 with high dimensional precision which are included by the vapor deposition mask 100. As the organic semiconductor element that is produced according to the production method of the present invention, an organic layer of an organic EL element, a light emitting layer, a cathode electrode and the like, for example, can be cited. In particular, the method for producing the organic semiconductor element of the present invention can be favorably used in production of the R, G and B light emitting layers of the organic EL element which are required to have pattern precision with high definition.

REFERENCE SIGNS LIST

100 Vapor deposition mask
10, 66 Metal mask
15 Slit
18 Bridge
20, 70 Resin mask
25 Opening
80 Vapor deposition mask device

The invention claimed is:

1. A method of producing an organic semiconductor element by vapor deposition, comprising the steps of:
arranging a vapor deposition target, a vapor deposition mask and a vapor deposition source in this order; and
forming an organic semiconductor element by using the vapor deposition mask,
wherein the vapor deposition mask comprises
a metal mask having a first opening, and
a resin mask that is stacked on the metal mask, the resin mask having second openings corresponding to a pattern to be to be produced by vapor deposition, and
wherein the resin mask faces the vapor deposition target during the forming step.

2. The method of producing an organic semiconductor element according to claim 1, wherein the organic semiconductor element is an organic electro luminescence layer and the pattern is a high-definition pattern exceeding 300 ppi.

3. The method of producing an organic semiconductor element according to claim 1, wherein the resin mask is made of a resin material having a thermal expansion coefficient of 16 ppm/° C. or less.

4. The method of producing an organic semiconductor element according to claim 1, wherein the resin mask is made of a resin material having a rate of humidity absorption of 1.0% or less.

5. The method of producing an organic semiconductor element according to claim 1, wherein a thickness of the resin mask is from 3 μm to 25 μm.

6. The method of producing an organic semiconductor element according to claim 1, wherein a cross-sectional shape of the second openings broadens towards the metal mask side.

7. The method of producing an organic semiconductor element according to claim 1, wherein a cross-sectional shape of the first opening broadens towards the vapor deposition source.

8. The method of producing an organic semiconductor element according to claim 1, wherein a cross-sectional shape of both the first opening of the metal mask and the second opening of the resin mask broadens towards a vapor deposition source direction.

9. The method of producing an organic semiconductor element according to claim 1, wherein a width of each second opening at an end thereof adjacent the metal mask is larger than a width of the second opening at another end thereof spaced from the metal mask.

10. The method of producing an organic semiconductor element according to claim 1, wherein a plurality of the second openings are provided at positions overlapping the first opening.

11. A method of producing an organic semiconductor element by vapor deposition, comprising the steps of:
    arranging a vapor deposition target, a vapor deposition mask and a vapor deposition source in this order; and
    forming an organic semiconductor element by using the vapor deposition mask,
    wherein the vapor deposition mask consists of
    a single metal mask having a first opening, and
    a single resin mask that is stacked on the metal mask, the resin mask having second openings corresponding to a pattern to be to be produced by vapor deposition, and
    wherein the resin mask faces the vapor deposition target during the forming step.

12. The method of producing an organic semiconductor element according to claim 11, wherein the organic semiconductor element is an organic electro luminescence layer and the pattern is a high-definition pattern exceeding 300 ppi.

13. The method of producing an organic semiconductor element according to claim 11, wherein the resin mask is made of a resin material having a thermal expansion coefficient of 16 ppm/° C. or less.

14. The method of producing an organic semiconductor element according to claim 11, wherein the resin mask is made of a resin material having a rate of humidity absorption of 1.0% or less.

15. The method of producing an organic semiconductor element according to claim 11, wherein a width of each second opening at an end thereof adjacent the metal mask is larger than a width of the second opening at another end thereof spaced from the metal mask.

16. A method of producing an organic semiconductor element by vapor deposition, comprising the steps of:
    arranging a vapor deposition target, a frameless vapor deposition mask and a vapor deposition source in this order; and
    forming an organic semiconductor element by using the frameless vapor deposition mask,
    wherein the frameless vapor deposition mask comprises
    a metal mask having a first opening, and
    a resin mask that is stacked on the metal mask, the resin mask having second openings corresponding to a pattern to be to be produced by vapor deposition, and
    wherein the resin mask faces the vapor deposition target during the forming step.

17. The method of producing an organic semiconductor element according to claim 16, wherein the resin mask is made of a resin material having a thermal expansion coefficient of 16 ppm/° C. or less.

18. The method of producing an organic semiconductor element according to claim 16, wherein the resin mask is made of a resin material having a rate of humidity absorption of 1.0% or less.

19. The method of producing an organic semiconductor element according to claim 16, wherein a cross-sectional shape of both the first opening of the metal mask and the second opening of the resin mask broadens towards a vapor deposition source direction.

20. A method of producing an organic semiconductor element by vapor deposition, comprising the steps of:
    arranging a vapor deposition target, a vapor deposition mask and a vapor deposition source in this order; and
    forming an organic semiconductor element by using the vapor deposition mask,
    wherein the vapor deposition mask comprises
    a metal mask having a first opening, and
    a resin mask that is stacked on the metal mask, the resin mask having second openings formed by laser irradiation corresponding to a pattern to be to be produced by vapor deposition, and
    wherein the resin mask faces the vapor deposition target during the forming step.

* * * * *